(12) United States Patent
Yu et al.

(10) Patent No.: US 6,456,223 B1
(45) Date of Patent: Sep. 24, 2002

(54) PIPELINED ANALOG TO DIGITAL CONVERTER USING DIGITAL MISMATCH NOISE CANCELLATION

(75) Inventors: Paul C. Yu, Coppell; Shereef Shehata, Dallas; Ranjit Gharpurey, Plano, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/715,228

(22) Filed: Nov. 17, 2000

Related U.S. Application Data (60) Provisional application No. 60/173,230, filed on Dec. 28, 1999.

(51) Int. Cl.[7] ................................................ H03M 1/38
(52) U.S. Cl. ........................................ 341/161; 341/172
(58) Field of Search ................................. 341/161, 144, 341/118, 120, 131; 370/320

(56) References Cited

U.S. PATENT DOCUMENTS

| | | | | |
|---|---|---|---|---|
| 5,144,308 A | * | 9/1992 | Norsworthy | 341/131 |
| 5,608,722 A | * | 3/1997 | Miller | 370/320 |
| 6,172,629 B1 | * | 1/2001 | Fetterman | 341/131 |
| 6,175,321 B1 | * | 1/2001 | Frannhagen | 341/143 |
| 6,232,903 B1 | * | 5/2001 | Koifman et al. | 341/144 |

* cited by examiner

*Primary Examiner*—Peguy JeanPierre
*Assistant Examiner*—Joseph Lauture
(74) *Attorney, Agent, or Firm*—J. Dennis Moore; W. James Brady III; Frederick J. Telecky, Jr.

(57) ABSTRACT

In a pipelined analog-to-digital converter (ADC) having an analog input signal and a digital output signal, and having a plurality of pipelined stages, each such stage having an analog input, an analog output comprising a residue voltage, and a digital output, the stage including a digital-to-analog converter substage having a plurality of capacitors and which are used in a sample-and-hold function and shuffled according to a predetermined procedure, a method for reducing noise generated from the shuffling when the capacitors are mismatched. The method includes the following steps. First, an estimation model is provided of the noise generated from the shuffling. The estimation model includes factors corresponding to mismatches of the capacitors. Mismatches among capacitors in the stage are estimated, based on the monitoring of an output parameter of the stage. A cancellation factor is generated by applying the mismatch estimations to the estimation model. Finally, the cancellation factor is subtracted from an ADC output to substantially reduce and/or effectively cancel the mismatch noise.

4 Claims, 8 Drawing Sheets

PIPELINED ANALOG TO DIGITAL CONVERTER USING DIGITAL MISMATCH NOISE CANCELLATION

This application claims priority under 35 U.S.C. §119(e)(1) of provisional application No. 60/173,230 filed Dec. 28, 1999.

TECHNICAL FIELD OF THE INVENTION

This invention relates to pipelined analog-to-digital converters, and more particularly relates to methods and apparatus for reducing distortion and noise in such converters.

BACKGROUND OF THE INVENTION

In pipelined analog-to-digital converters (ADCs) a major objective is to achieve maximum spurious-free dynamic range (SFDR). One way in which this is achieved is by reducing spurious signals, such as harmonics. Such spurious signals can arise from the existence of mismatch between the capacitors used in the digital-to-analog converter (DASC) substages of such pipelined ADCs. One way of reducing such spurious signals is to convert such signals into noise, at the expense of signal to noise ratio (SNR). An example of such a technique can be found in co-pending U.S. patent application Ser. No. 09/712,719, filed on Nov. 14, 2000. Such techniques can provide a significant improvement in SFDR. However, it is desired to maintain the improved SFDR due to shuffling while improving SNR of pipelined ADCs that use shuffling.

SUMMARY OF THE INVENTION

The present invention provides, in a pipelined analog-to-digital converter (ADC) having an analog input signal and a digital output signal, and having a plurality of pipelined stages, each such stage having an analog input, an analog output comprising a residue voltage, and a digital output, the stage including a digital-to-analog converter substage having a plurality of capacitors and which are used in a sample-and-hold function and shuffled according to a predetermined procedure, a method for reducing noise generated from the shuffling when the capacitors are mismatched. The method includes the following steps. First, an estimation model is provided of the noise generated from the shuffling. The estimation model includes factors corresponding to mismatches of the capacitors. Mismatches among capacitors in the stage are estimated, based on the monitoring of an output parameter of the stage. A cancellation factor is generated by applying the mismatch estimations to the estimation model. Finally, the cancellation factor is subtracted from an ADC output to substantially reduce and/or effectively cancel the mismatch noise.

These and other features of the invention will be apparent to those skilled in the art from the following detailed description of the invention, taken together with the accompanying drawings.

DETAILED DESCRIPTION OF THE PREFERRED EMBODIMENT

Before discussing the details of the preferred embodiments of the present invention background is now presented that is useful in understanding the concepts involved in such embodiments.

Figure 1:
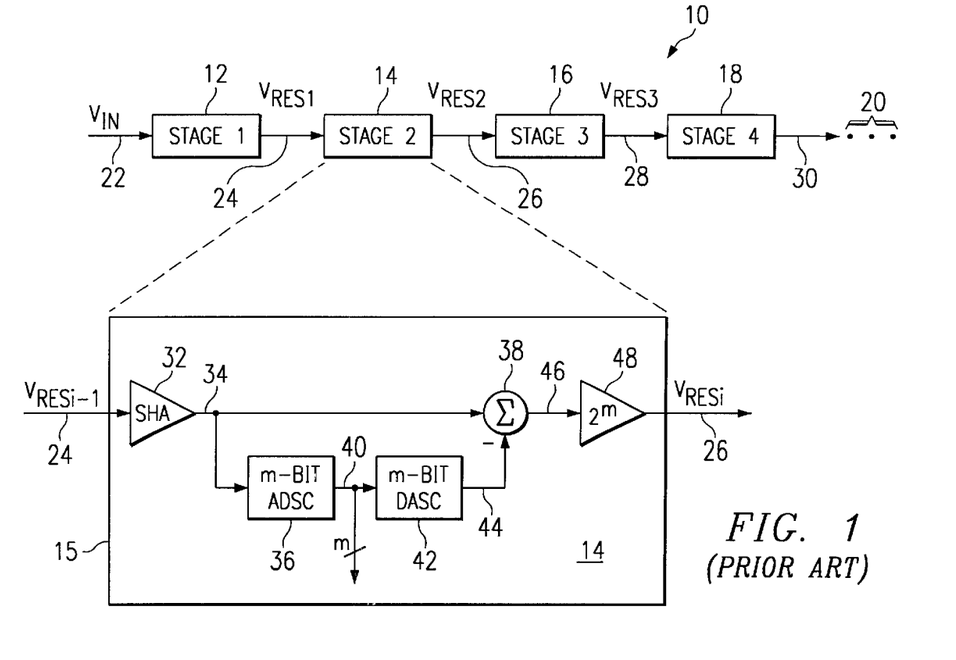
FIG. 1 is a block diagram of a prior art analog to digital converter.

A conventional multi-bit per stage, pipelined ADC 10 is shown in FIG. 1. Four stages 12, 14, 16, 18 are shown; however, as shown by ellipsis 20, further stages may be included. An analog input signal $V_{IN}$ is provided on line 22 to stage one 12. A first residual signal $V_{RES1}$ is provided on line 24 from stage one 12 to stage two 14. A second residual signal $V_{RES2}$ is provided on line 26 from stage two 14 to stage three 16. A third residual signal $V_{RES3}$ is provided on line 28 from stage three 16 to stage four 18. A further residual signal is provided from stage four 18 on line 30, and so forth.

Typically, all of the stages of a pipelined ADC such as ADC 10 are the same. In FIG. 1, the functional components of stage two 14 are shown by way of example. Thus, referring to the blowup 15 of stage two 14, input line 24 can be seen, which is an input to sample and hold amplifier ("SHA") 32. The output of SHA 32 is provided on line 34 to an m-bit analog-to-digital subconverter (ADSC) 36, which is typically a flash ADC, and to a first input of a summing unit 38. The output of m-bit ADSC 36 is an m-bit sub-word, which is provided on line 40 both as an output to stage two 14 and is provided as an input to m-bit digital-to-analog subconverter (DASC) 42. The output of m-bit DASC 42 is provided on line 44 to a subtracting input to summing unit 38. The output of summing unit 38 is provided on line 46 to a $2^m$ amplifier 48, which has a theoretical gain of $2^m$. The output of $2^m$ amplifier 48 is provided on line 26.

In operation, stage two 14 operates as follows. An analog signal is provided on line 24 to SHA 32. SHA 32 samples the analog signal on line 24 at a succession of times and holds each such sample as a signal level on line 34 for a time sufficient to permit m-bit ADSC 36 to sense the level of the signal on line 34 and provided a digital representation thereof, as a sub-word of m-bits, on line 40. Those m-bits are converted to an analog voltage signal by m-bit DASC 42, and provided on line 44. The analog signal on line 44 is subtracted from the input signal on line 34 by summing unit 38, and the difference signal is provided on line 46 to amplifier 48, where it is amplified by a factor of $2^m$. The difference signal on line 46 represents the negative of the error made by the m-bit ADSC 36. Theoretically, that error signal represents the inaccuracy of the m-bit representation of the analog signal on line 24 due to the limited number of bits. That error signal, amplified by $2^m$, is input to the following stage of the pipeline via line 26, where a similar set of operations is performed.

After the signal propagates through n stages, a digital sample of the input signal $V_{IN}$ is obtained. Each of the sub-word bit lines provided at the output of the respective stage's ADSC, e.g., bit lines 40 from ADSC 36, contributes to the overall digital word which is the digital representation provided by ADC 10 of the sampled signal $V_{IN}$. The sub-word bit lines are concatenated to form this word. A new word is generated for each time period for which a sample is taken in the sample and hold amplifiers, e.g., SHA 32.

Figure 2:
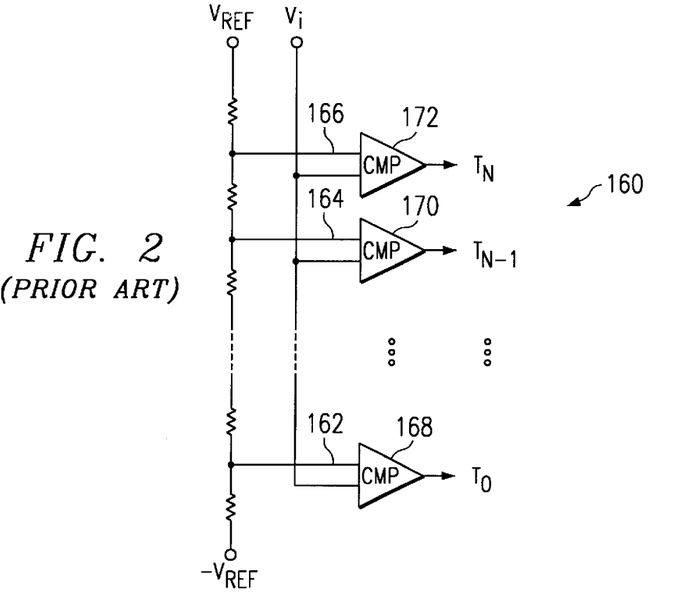
FIG. 2 is a circuit diagram of a typical prior art flash A/D.

FIG. 2 is a circuit diagram of a typical prior art flash ADC, such as used as an m-bit ADSC 36 (FIG. 1), for example. A series string of resistors 160, all having substantially the same resistance value, is connected between a positive reference voltage $V_{REF}$ and a negative reference voltage $-V_{REF}$, as is shown in the figure. The common connection nodes of adjacent resistors form a number of tap points 162, . . . 164, 166, that are provided to the same number of comparators 168, . . . , 170, 172. An analog input voltage $V_i$ is provided to the other input of each of the comparators 168, . . . , 170, 172. Designating the scaled reference voltage at the tap points as $V_{REFn}$, a given comparator outputs a 1 if $V_i > V_{REFn}$, and outputs a 0 if $V_i < V_{REFn}$. These outputs of the comparators 168, . . . , 170, 172, are designated $T_0, \ldots T_{N-1}$, $T_N$, respectively, and together form a code commonly referred to as a thermometer code (TC). The TC is a digital representation of the analog input voltage $V_i$, The TC is converted to a binary code, which is the m-bit sub-word discussed above in connection with in FIG. 1.

Figure 3:
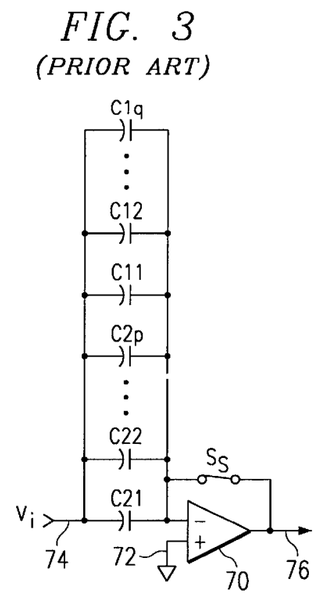
FIG. 3 is a circuit diagram of a pertinent portion of a sample and hold amplifier in a first phase configuration.

FIG. 3 is a circuit diagram of pertinent portions of a pipelined stage such as used as an m-bit DASC 42, summing unit 38, and $2^m$ amplifier 48 (FIG. 1), for example, as configured in a first phase, that of sampling. In the circuit of FIG. 3 is a differential amplifier 70, having a non-inverting input connected to ground by way of a line 72. An input line 74 provides an analog input voltage $V_i$ to two sets of capacitors, a first set C11, C12, . . . , C1q, and a second set of capacitors C21, C22, . . ., C2p, all of which capacitors are connected in parallel between the input line 74 and an inverting input of amplifier 70. The numbers p and q are, in general, selectable, depending upon the performance desired versus the chip area to be occupied by the sample and hold amplifier. The inverting input of amplifier 70 is also connected by way of a switch $S_S$ to the output of amplifier 70, line 76, in accordance with similar principles as those discussed above with reference to switch $S_S$ in FIG. 2. Thus, switch $S_S$ provides a virtual ground connection for capacitors C11, C12, . . . , C1q, and capacitors C21, C22, . . . , C2p, so that they can charge up during the sample phase, and capture the sampled voltage $V_i$ at the sample time. Switch $S_S$ is opened at the end of the sample phase to capture that charge for use in the next, amplifying phase.

Figure 4:
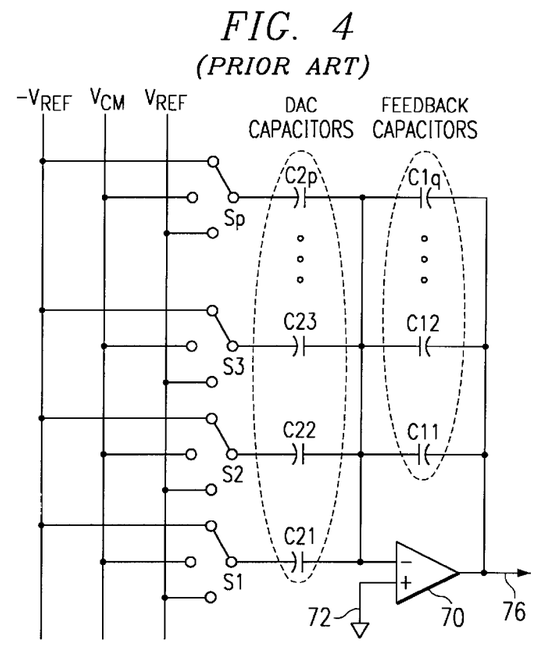
FIG. 4 is a circuit diagram of a pertinent portion of a sample and hold amplifier in a second phase configuration.

FIG. 4 is a circuit diagram of the circuit of FIG. 3, as configured in a second phase, that of amplification. As can be seen, in FIG. 4 the capacitors in the first group, C11, C12, . . . C1q, are now connected all in parallel as feedback capacitors between the output line 76 and the inverting input of amplifier 70. The capacitors in the second group, C21, C22, . . . C2p, are now all connected in parallel together as DAC capacitors between the negative input of amplifier 70 and to a respective one of a corresponding number of switches S1, S2, . . . Sp. Each of these switches, S1, S2, . . . Sp, allows the port of its respective DAC capacitor to be connected to $V_{REF}$, $V_{CM}$, or $-V_{REF}$, depending upon the position of the switch. Note that $V_{CM}$ may not be used and, in addition, more than three reference voltages may be used, depending on the design considerations. The positions of the switches are determined by the value of the thermometer code TC, discussed above, and function to reduce the resulting amplified voltage output of amplifier 70 by an amount corresponding to the value of the m-bit sub-word discussed above in connection with in FIG. 1. This ensures that the output of amplifier 70 is the residue of the stage, for provision to the next stage in the pipeline.

Now, in switching the feedback capacitors and DAC capacitors randomly among one another, the connections of the DAC capacitors to $V_{REF}$, $V_{CM}$, and $-V_{REF}$ are randomized, for example with a pseudo-random code generated by a digital circuit. As mentioned above, the numbers p and q are selectable. Out of the p number of unit capacitors, depending on the digital decisions, a selectable number i of them may be connected to $V_{REF}$, j of them to $-V_{REF}$, and k of them to $V_{CM}$. Over time, however, part or all of the q feedback capacitors may be used as the DAC capacitor, and vice versa.

Note that the circuits shown in FIGS. 3, 4, 5 and 6 are single ended, for ease of explanation. The principles implemented in such circuits are essentially the same for circuits that are fully differential, and the considerations involved in implementing the present invention are essentially the same as those discussed herein, with the considerations applying to both differential paths, rather than to only the one path in a single-ended circuit.

In $\Sigma$-$\Delta$ ADCs, capacitor mismatch results in DASC errors only. This DASC error can be reduced by using a number of dynamic element matching ("DEM") techniques previously proposed for linearizing the DASC in multi-bit $\Sigma$-$\Delta$ ADCs. By using a time varying combination of capacitors to represent the given DASC output level, the element mismatch errors are averaged out over time, thereby linearizing the DASC. The same considerations apply to single stage digital-to-analog converters (DACs).

In a conventional pipelined ADC, there are several error sources. Two of these error sources are the DASC and the interstage gain error, both of which occur if the capacitors are not perfectly matched. Direct application of existing DEM techniques for linearizing DAC errors as used in $\Sigma$-$\Delta$ ADCs are not very effective since interstage gain errors can still degrade the overall linearity of the pipelined ADC. This can result in harmonic distortion that limits the SFDR.

One DEM technique that reduces both DASC and interstage gain error is to switch the feedback capacitors and DAC capacitors among one another randomly. See U.S. Patent No. [U.S. patent application Ser. No. 09/391,968] for a patent that uses this technique. The principles of the present invention may be applied to such techniques to increase the SNR by canceling the mismatch noise resulting from shuffling.

Figures 5, 6:
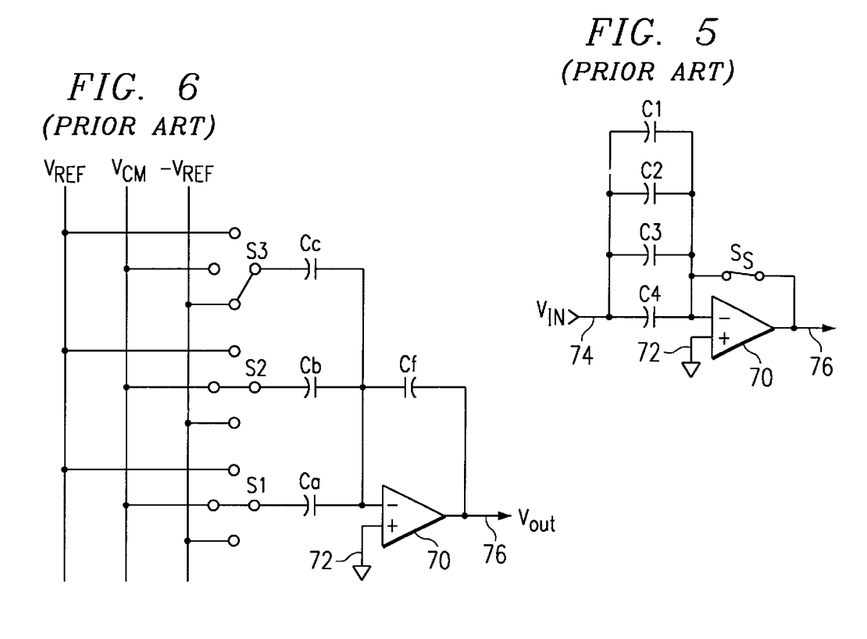
FIG. 5 is a circuit diagram of a sample and hold amplifier having four capacitors, in a first configuration.
FIG. 6 is a circuit diagram of a sample and hold amplifier having four capacitors, in a second configuration.

Preferred embodiments of the shuffling network of the present invention will be now described in the context of a 2.8 b/stage pipelined architecture implemented in a 14b 70MS/s ADC, such as the TI® THS1470 manufactured by Texas Instruments Incorporated. In this case, the total number of capacitors used is four as shown in the conventional implementation in FIGS. 5 and 6. The four capacitors are labeled C1, C2, C3 and C4, in FIG. 5. Switches S1, S2 and S3 are provided, as shown in FIG. 6, for switching the DAC capacitors, labeled Ca, Cb and Cc, to $V_{REF}$, $V_{CM}$ or $-V_{REF}$, depending on the value of the TC, as discussed above. The output of the amplifier 70 is $V_{out}$, the residue. The switching scheme utilized in the preferred embodiment uses random capacitor swapping, using pseudo-random codes. However, other swapping schemes may be used, and arrangements using the principles of the present invention in such cases are considered within the scope of the present invention, as set forth in the claims appended hereto.

Figure 7:
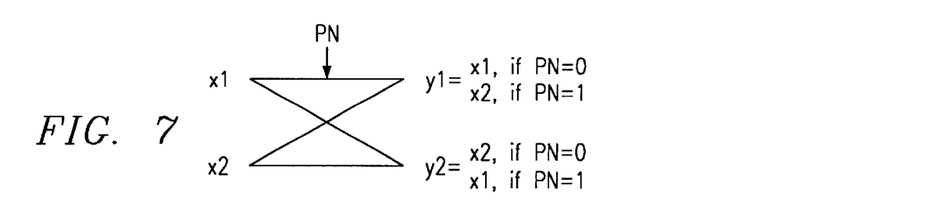
FIG. 7 is a diagram of a swapping cell used in preferred embodiments of the present invention.

The swapping is implemented in the preferred embodiment using a network of swapper cells, in particular a parallel swapping network (PSN). A swapper cell is shown in FIG. 7. Based on the control of a one-bit pseudo-random code, PN, the 2 bits output by the swapper cell are either a swapped or non-swapped version of the 2 bits input to the cell. In this case, if PN=0 the output is non-swapped, while if PN=1 the output is swapped. Designating the two bits input to the cell as x1 and x2, then the non-swapped outputs y1 and y2 are equal to x1 and x2, while the swapped output is equal to x2 and x1, as shown in the figure. Swapper cells are well known.

Figure 8:
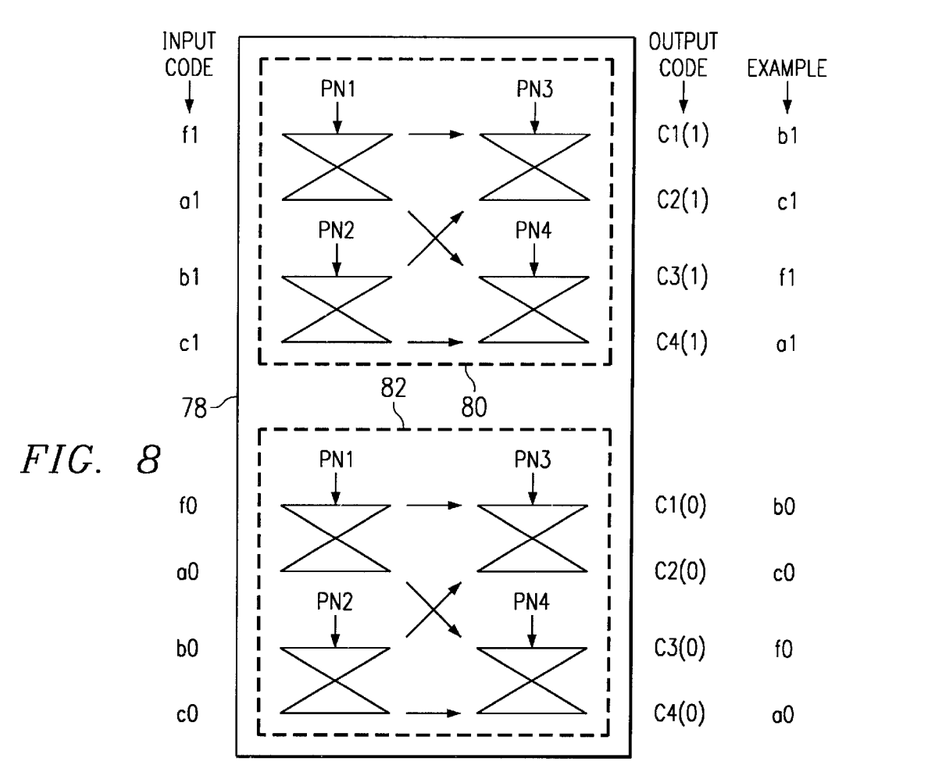
FIG. 8 is a diagram of a parallel shuffling network (PSN) of a first preferred embodiment of the present invention.

FIG. 8 shows a PSN 78 of a first preferred embodiment of the present invention, in which a novel parallel configuration is utilized. The PSN 78 consists of two identical networks 80, 82, shown in parallel in the figure. Each of the two networks 80, 82, is a 2×2 swapper unit that includes four of the swapper cells described above in connection with FIG. 7. The control signals PN1–4 are applied to the four swapper cells in each of the parallel networks 80, 82, as shown.

The inputs to the shuffling network are two-bit codes a1a0, b1b0, c1c0, and f1f0. A code of 11 represents the value −1, a code of 00 represents the value 0, and a code of 01 represents the value 1, all used in connection with the designation of a capacitor to be a DAC capacitor. A code of 10 is used to designate a capacitor as a feedback capacitor. Now, it will be recalled that the feedback capacitors are shuffled along with the DAC capacitors, such that the bottom plate of each capacitor can have one of four connections: $V_{REF}$, $V_{CM}$, $-V_{REF}$, and VOut of the amplifier 70 (FIG. 6). The three codes a1a0, b1b0, and c1c0, which are derived from the thermometer output TC of the flash ADC used as the ADSC, determine the three possible reference levels $V_{REF}$, $V_{CM}$, and $-V_{REF}$, to which each of the three DAC capacitors are to be connected. A code value of 1 indicates connection to $V_{REF}$, a code value of 0 indicates connection to $V_{CM}$, and a code value of −1 indicates connection to $-V_{REF}$. As mentioned above, a code of 10 indicates use as a feedback capacitor, i.e., connection to $V_{out}$. The feedback capacitor Cf (FIG. 6) is associated with the two-bit code f1f0. The remaining capacitors Ca, Cb and Cc, are associated with codes a1a0, b1b0 and c1c0, respectively.

The two bit input codes are split into MSB and LSB and are input to the top network 80 and the bottom network 82, as shown in FIG. 8. The MSB and LSB are shuffled in parallel based on the control signals PN1–4 which are codes generated from a pseudo-random number generator (not shown), which may be of any conventional type. Performing the shuffling in parallel ensures the high-speed required by the performance demands found today in many ADC applications, for example 70MS/s. At the output of the PSN 78, the position where the input code appears indicates whether the capacitor associated with the code is to be connected to $V_{REF}$, $V_{CM}$, $-V_{REF}$, or $V_{out}$ of the op-amp, in accordance with the code scheme described hereinabove. Thus, the top position is associated with C1, the next position down with C2, then C3, with the bottom position being associated with C4.

The control signals PN1–4 may all be different pseudo-random code sequences, or the same sequences but time shifted with respect to one another. The codes for some of the control signals PN1–4 may even be the same pseudo-random codes. The use of all different pseudo-random codes, however, assures that the harmonic components from mismatch errors are converted most completely to white noise.

Also, it will be appreciated that the number of codes for a given PSN will depend on the size and configuration of the particular PSN.

An example is shown at the right side of FIG. 8. As a result of particular control signals PN1–4 which are applied in FIG. 8, f1f0 appears at the third position from the top. Accordingly, C3 is selected as the feedback capacitor Cf (FIGS. 5, 6). At the same time, C1, C2, and C4 are selected as the DAC capacitors Cb, Cc and Ca, since the codes b1b0, c1c0 and a1a0 appear at the first, second and fourth positions from the top at the output of PSN 78.

Applying the code scheme described above, assume that the input codes a1a0, b1b0, and c1c0 are assigned the values −1, −1, and 0, respectively. Based on the example shown in FIG. 8, this means that capacitor C1 which is assigned code b1b0 will be connected to −VREF, capacitor C2 which is assigned c1c0 will be connected to VCM and capacitor C4 which is assigned a1a0 will be connected to −VREF.

Thus, three of the four possible states represented by the two-bit code is used to determine the three possible reference levels VREF, VCM, and −VREF, to which the three DAC capacitors are to be connected. The fourth state of the two-bit code, f1f0, is used to determine if the capacitor is to be a feedback capacitor. In this manner, the feedback capacitor and the DAC capacitors are shuffled simultaneously in high speed.

Now, while the specific embodiment described hereinabove is in the context of a four capacitor DASC, the inventive concepts can be applied more generally, to any number of p, q, capacitors (FIGS. 3, 4). Easiest is application to a pipelined stage having a binary number of capacitors. In such applications the PSN 78 is simply expanded in width and/or height as necessary to provide the appropriate shuffling. In applications to DASCs having a non-binary number of capacitors, a PSN may be provided as described above, and an additional layer of coding provided to the output of the PSN to provide the appropriate shuffling.

The general approach taken in accordance with the principles of the present invention to reduce mismatch noise in a given stage of a pipelined ADC is to, first, provide a model of the noise so generated. Second, an estimate of the mismatches among the DASC capacitors in the stage is made, based on the monitoring of an output parameter of the stage. Then, the estimate is used in conjunction with the model to generate a cancellation factor which is subtracted from the ADC output to substantially reduce and/or effectively cancel the mismatch noise.

Unlike conventional analog or digital self calibration techniques, the technique proposed herein estimates capacitor mismatch and corrects for its effect in the background, without interrupting normal operation of the ADC or sacrificing conversion speed or signal bandwidth, or requiring power consuming duplicate analog circuitry. Compared with conventional one-time, factory calibration, the proposed technique does not involve extra costly test time on the production line. Since the technique continuously provides estimated value of mismatch, in tracks supply and temperature variations which the one time factory calibration does not provide. The result is a high accuracy, user transparent technique that largely removes the undesirable effect of capacitor mismatch, while achieving high SFDR and high SNR for the ADC.

The invention is implemented, as a general matter, by using known techniques to develop a model of the swapper cell. From that, a model of the shuffling network of swapper cells is developed. This is combined with a model of the pipeline stage that incorporates the capacitor shuffling. From this model the mismatch noise is computed, and then subtracted from the digital output of the ADC. The overall model is preferably simple enough to allow computations of this noise in real-time, but not so simple as to overly degrade the desired performance (noise cancellation). Simplifications may be made to the equations constituting the model.

Preferred embodiments will now be discussed. Thus, referring to the DASC stage shown in FIGS. 5 and 6, in which a total of four capacitors are used, the model for the residue voltage is:

$$V_{RES} = G \cdot E + \frac{1}{G}\left\{\sum_{i=1}^{3} PN_i \Delta_i (\gamma_i + G \cdot E)\right\} + \qquad \text{Eq. (1)}$$

$$\frac{1}{G} PN_1 PN_2 \Delta_2 (\gamma_{12} - G \cdot E) - \frac{1}{G} PN_1 PN_3 \Delta_3 (\gamma_{13} - G \cdot E)$$

where

G=interstage gain error=4,
E=quantization error,
$PN_i$=the ith PN sequence,
$\gamma_1$=b−a−c,
$\gamma_2$=$\gamma_3$=−b+a−c,
$\gamma_{12}$=$\gamma_{13}$=b+a−c,
$\Delta_1$+$\epsilon_1$+$\epsilon_2$−$\epsilon_3$−$\epsilon_4$,
$\Delta_2$=$\epsilon_1$−$\epsilon_2$, and
$\Delta_3$=$\epsilon_3$−$\epsilon_4$.

In the above factors, a, b and c represent the connections of capacitors Ca, Cb and Cc, respectively, in FIG. 6, to $V_{REF}$, $V_{CM}$ or −$V_{REF}$, as the case may be, having the value +1, 0 or −1, respectively. The specific coding used in this embodiment is as follows. A code of 10 represents the value −1, a code of 00 represents the value 0, and a code of 01 represents the value 1, all used in connection with the designation of a capacitor to be a DAC capacitor. A code of 11 is used to designate a capacitor as a feedback capacitor. In addition, $\epsilon_i$ represents the % error of $C_i$ in FIG. 6.

Note that in Equation (1) the terms containing $\Delta_i$ are modulated by $PN_i$ or products of $PN_i$, representing the distortion due to capacitor mismatch being converted into white noise. In addition, these terms are also multiplied by the sum of γ terms and amplified quantization terms, G·E. Within the product of this multiplication, the terms containing γ represent the noise resulting from DAC capacitor shuffling, while the terms containing amplified quantization G·E represent the fact that inter-stage gain error is being averaged out by shuffling the feedback capacitors.

Next, the mismatch, $\Delta_i$, is estimated. This is done by correlating $PN_i$ with $V_{RES}$. Since the PN sequences are uncorrelated with the quantization error in this embodiment, and the average of the quantization error is zero, the mismatch parameters may be estimated as:

$$\hat{\Delta}_i = \frac{G \cdot \text{Avg}\{PN_i \cdot V_{RES}\}}{\text{Avg}\{\gamma_i\}}, \qquad \text{Eq. (2)}$$

where the symbol "$\hat{\bigcirc}$" denotes estimate.

The expression for mismatch set forth in Equation (2) provides good accuracy and may be implemented such that the resulting computations are not excessively extensive. Once the principles of the invention, as set forth herein, are understood other expressions will readily occur to those of ordinary skill in this art area that will, for example, yield higher accuracy, perhaps with greater computational complexity. This may be desirable in certain applications. For example, it may be beneficial to use in the estimation expression a combination of factors, such as the product of PN sequences with Walsh codes. In such case, the same codes would be applied to the shuffler. All such variations are considered to be within the scope of the invention.

Once the mismatch parameters are estimated, the mismatch noise is canceled in two steps, in this embodiment. First, the estimate of the DAC noise is expressed, using the terms in Equation (1), as:

$$\text{Noise}_{DAC} = \qquad \text{Eq. (3)}$$

$$\frac{1}{G}\left\{\sum_{i=1}^{3} PN_i \hat{\Delta}_i \gamma_i\right\} + \frac{1}{G} PN_1 PN_2 \hat{\Delta}_2 \gamma_{12} - \frac{1}{G} PN_1 PN_3 \hat{\Delta}_3 \gamma_{13}$$

Subtracting Noise$_{DAC}$ from Eq. (1), in which terms that are estimated are replace by their estimate values, yields:

$$V_{RES,DAC} = \qquad \text{Eq. (4)}$$

$$G \cdot \left\{1 + \frac{1}{G}\left\{\sum_{i=1}^{3} PN_i \hat{\Delta}_i\right\} - \frac{1}{G} PN_1 PN_2 \hat{\Delta}_{12} + \frac{1}{G} PN_1 PN_3 \hat{\Delta}_3\right\} \cdot E$$

Multiplying Eq. (4) with $$\left\{1 - \frac{1}{G}\left\{\sum_{i=1}^{3} PN_i \hat{\Delta}_i\right\} + \frac{1}{G} PN_1 PN_2 \hat{\Delta}_{12} - \frac{1}{G} PN_1 PN_3 \hat{\Delta}_3\right\}$$

yields $$V_{RES,ideal} \cong \qquad \text{Eq. (5)}$$

$$\left\{1 - \frac{1}{G}\left\{\sum_{i=1}^{3} PN_i \hat{\Delta}_i\right\} + \frac{1}{G} PN_1 PN_2 \hat{\Delta}_{12} - \frac{1}{G} PN_1 PN_3 \hat{\Delta}_3\right\} \cdot$$

$$V_{RES,DAC} = G \cdot E$$

Hence, the mismatch noise is canceled. Since the following stages of the pipeline digitize $V_{RES}$, the estimation and cancellation processes may be carried out in the digital domain. Digital implementation is considered preferred, and is now described.

Initially, certain intermediate terms are employed in the computations that are described below. These terms are:

$$X_1 = \Delta_1/G, \quad \text{Eq. (6)}$$

$$X_2 = \Delta_2/G, \quad \text{Eq. (7)}$$

and $$X_3 = \Delta_3/G \quad \text{Eq. (8)}$$

Figure 9:
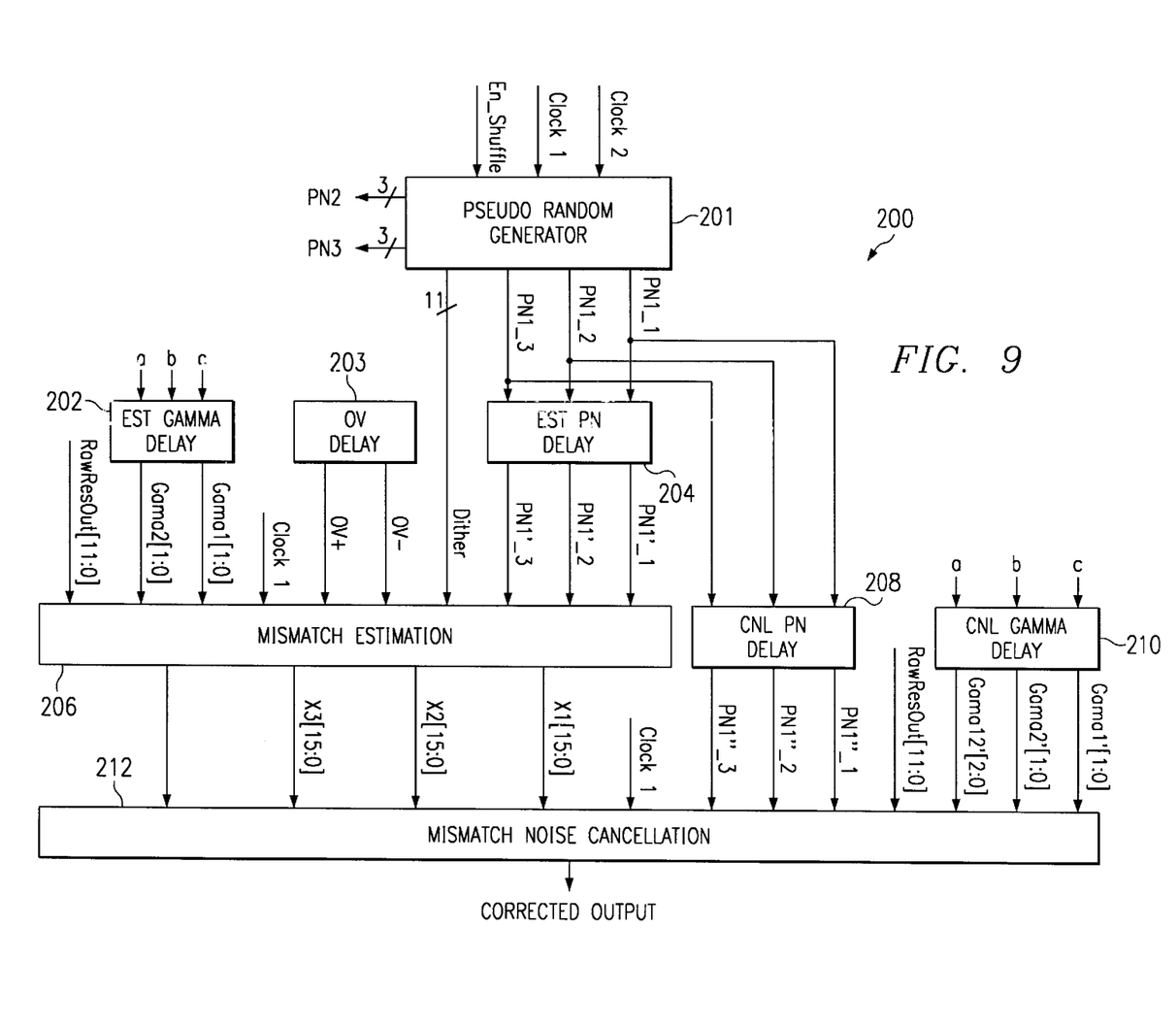
FIG. 9 is a high level block diagram of the system of the preferred embodiment of the present invention.

FIG. 9 is a high level block diagram of the Mismatch Noise Cancellation System 200 of the preferred embodiment of the present invention, showing the architecture thereof, i.e., the overall process involved in the method of the preferred embodiment of the present invention, for mismatch noise cancellation. include are a Pseudo Random Generator (PRG) unit 201, an Estimation Gamma Delay (EGD) unit 202, an Overload Delay (OD) unit 203, an Estimation PN Delay (EPND) unit 204, a Mismatch Estimation (ME) unit 206, a Cancellation PN Delay (CPND) unit 208, a Cancellation Gamma Delay (CGD) unit 210, and a Mismatch Noise Cancellation (MNC) unit 212.

The OD unit 203, the EPND block 204, the CPD block 208, and the CGD block 210 are not shown nor described in detail, as these blocks merely provide appropriate delay to the respective signals input thereto. Many techniques are available to the designer to accomplish this delay, all of which are well known in the art. The particular technique selected is not considered critical to the practice of the invention. The amount of delay provided by each such block, which is important, is described in detail below. Also not shown in FIG. 9 is a Reset signal, which is a global signal that is an input to all the units shown in the figure.

The PRG unit 201 generates random binary sequences for use by the other units shown in FIG. 9. The ME unit 206 computes an estimation of the capacitor mismatch. The EGD unit 202, OD unit 203, the EPND unit 204, the CPND unit 208 and the CGD unit 210, all synchronize the data flow within the mismatch noise cancellation process shown in FIG. 9. The various lines and signals shown in FIG. 9 are explained in detail below, and are shown in FIG. 9 so that the overall signal flow may be seen in a single diagram.

The PRG unit 201 may be of any conventional construction and/or architecture. The requirement is merely that it generate random or pseudo-random codes so that the mismatch error is converted to white noise. A preferred embodiment of the PRG unit 201 is shown in detail in FIG. 10. It is based on a maximum extent linear feedback shift register (LFSR) having 31 stages $b_0$ 222, $b_1$ 224, $b_2$ 226, $b_3$ 228, ... $b_{29}$ 230, $b_{30}$ 232, in which feedback is provided at stages 0, 2 and 30, via path 234 to adder 236 and LSB stage 222, as shown. An XOR (i.e. modulo 2 adder) may be used for adder 218. The resulting feedback polynomial implemented by the PRG 201 is $1+x^{3}+x^{31}$. An adder is not needed at stages 0 and 30, as they are the least significant bit (LSB) and most significant bit (MSB), respectively.

Figure 10:
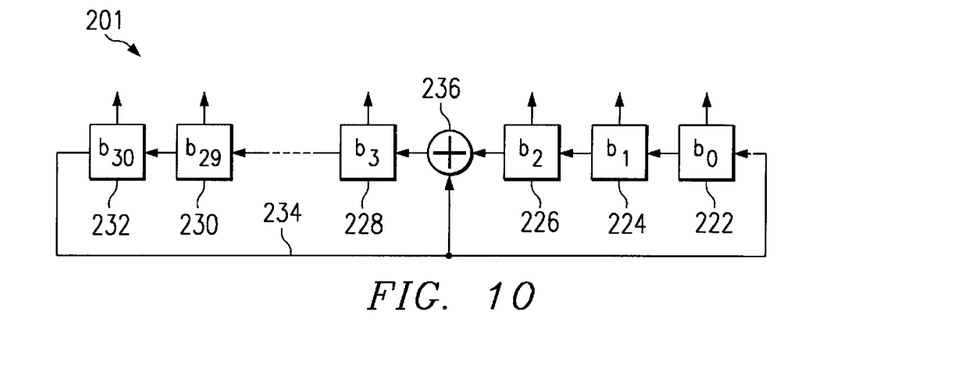
FIG. 10 is a logic diagram of the PRG unit 201 shown in FIG. 9.
Figure 11:
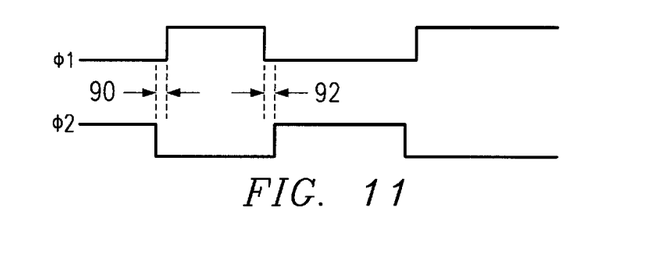
FIG. 11 is a signal diagram of the two clocks used in the preferred embodiment of the present invention.

The PRG 201 receives two clocks, clock $\phi 1$ and clock $\phi 2$, signal diagrams of which are shown in FIG. 11. These two clocks are non-overlapping clocks, the leading edge of clock $\phi 1$ lagging the falling edge of clock $\phi 2$ by interval 90, and the leading edge of clock $\phi 2$ lagging the falling edge of clock $\phi 1$ by interval 92, as shown. The specific inputs to the various stages of the PRG unit 201 of these clocks are not shown in FIG. 10, as they are well known.

The PRG 201 outputs three sets of one bit PN signals, each set for a different one of the first three stages in the pipelined ADC. Each set includes three one bit PN signals. Thus, the signals for stage 1 are PN1_1, PN1_2 and PN1_3; the signals for stage 2 are PN2_1, PN2_2 and PN2_3; the signals for stage 3 are PN3_1, PN3_2 and PN3_3. These signals are taken from the stages of the PRG 201, as set forth in Table 1, as follows:

TABLE 1

| Signal | Stage No. |
|--------|-----------|
| PN1_1  | 24 |
| PN1_2  | 21 |
| PN1_3  | 18 |
| PN2_1  | 15 |
| PN2_2  | 12 |
| PN2_3  | 9 |
| PN3_1  | 6 |
| PN3_2  | 3 |
| PN3_3  | 0 |

These bits, i.e., stage numbers, were selected to provide minimum cross-correlation among them. However, it will be appreciated that other bit positions may be used, other length LFSRs used, and even other random number generators used, and still remain within the scope of the invention as set forth in the appended claims. Only the PN signals for stage 1, i.e., PN1_1, PN1_2 and PN1_3, are used in the embodiment being discussed, as noise cancellation is only required for stage 1, the noise contribution of stages 2 and 3 from the capacitor shuffling being significantly less than that contributed by stage 1.

The PRG 201 also outputs an eleven bit random dither signal Dither[10:0], which is provided to the ME unit 206. In the preferred embodiment these eleven bits are from stage numbers 30 to 20.

The PRG unit 201 also receives an Enable Shuffle signal, which, if in negative mode disables the capacitor shuffling. When disabled, the PRG unit 201 outputs all zeros for each PN signal in each of the sets of PN signals. This is accomplished by ANDing the outputs with the Enable Shuffle signal, so that when Enable Shuffle is zero, i.e., signaling disabling of the capacitor shuffling, the outputs become zero.

The Reset signal, mentioned above, causes an initial value to be placed into the shift PRG unit 201 stages, specifically 0001111000011110000111110000000.

The three sets of PN signals for stage 1, PN1 (PN1_1, PN1_2 and PN1_3), are delayed, by a duration described in detail below, in EPND unit 204. The delayed sets of signals, PN1' (PN1'_1, PN1'_2 and PN1'_3), are provided as inputs to ME unit 206. The EGD unit 202 receives signals representing the DAC capacitor connections a, b and c, and determines $$\gamma_1 = b - a - c,$$

and $$\gamma_2 = \gamma_3 = -b + a - c$$

as discussed above in conjunction with Equation (1). The EGD unit 202 also delays the provision of these signals until the appropriate time for utilization by the ME unit 206, as is described in detail below. The signals provided to the ME unit 206 by the EGD unit 202 are Gama1[1:0] and Gama2 [1:0], representing $\gamma_1$ and $\gamma_2$, from the above equations, and having the appropriate delay. The same function is provided by the CGD unit 210, except that, in addition, the CGD unit also determines $$\gamma_{12} = \gamma_{13} = b + a - c,$$

as discussed above in conjunction with Equation (1), and the delay of the signals is for the purpose of providing these signals at the appropriate time for the MNC unit 212. These delayed signals provided to the MNC unit 212 are Gama1[1:0], Gama2'[1:0] and Gama12'[2:0], representing $\gamma_1$, $\gamma_2$, and $\gamma_{12}$ from the above equations, and having the appropriate delay. In fact, the calculations of these signals being closely related, the functions of EGD unit 202 and of CGD unit 210 may be merged, so that calculations of Gama1[1:0] and Gama2[1:0] are done only once, with different delay circuitry being provided for the two different sets of signals. This is, in fact, considered preferred.

Other signals provided to the ME unit 206 include an OV+ and an OV− signal, that signal positive and negative overload, respectively, of the pipelined ADC input signal. The OV+ and OV− signals are appropriately delayed by OVD unit 203. Finally, the 12 bits of the stages of the pipelined ADC subsequent to the first stage, which provide a digital representation of the residue signal of the first stage, are provided as an input RawResOut[11:0] to the ME unit 206. This input, RawResOut[11:0], is shifted such that the center of the range of its values is zero.

Figure 12:
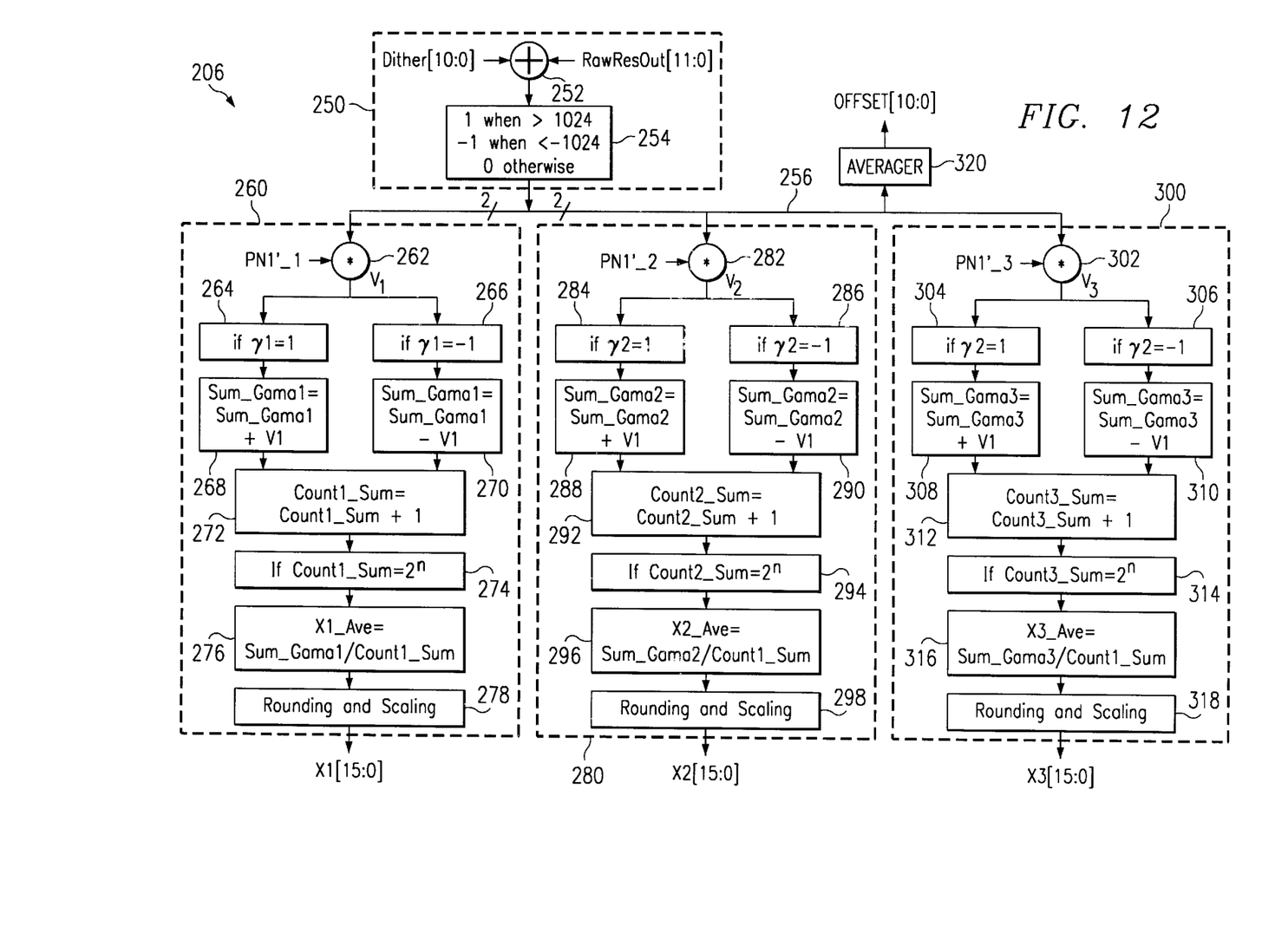
FIG. 12 is a flow diagram of the processes performed by the ME unit 206 shown in FIG. 9.

The ME unit 206 takes the binary random sequences of the delayed sets of signals, PN1'_1, PN1'_2 and PN1'_3, the Dither[10:0] signal, and the gamma values $\gamma_1$ and $\gamma_2(=\gamma_3)$, provided as signals Gama1[1:0] and Gama2[1:0], as inputs. The ME unit 206 then estimates the mismatch, expressed as the quantities $X_1$, $X_2$ and $X_3$, discussed above in conjunction with Equations (6), (7) and (8), and provides these as 16 bit outputs X1[15:0], X2[15:0] and X3[15:0]. The ME unit 206 also calculates a value representing a voltage offset that may be present in the analog input to the pipelined ADC, and provides that value as a signal, OFFSET. FIG. 12 is a flow diagram of the processes performed by the ME unit 206. If implemented in hardware, FIG. 12 represents a block diagram of the circuitry at the functional level. If implemented in software, FIG. 12 represents a flow chart of the implementing software. Of course, the processes shown in FIG. 12 may be implemented partially in hardware and partially in software, as desired by the designer.

The ME unit 206 includes five main functional blocks, a dither and requantization subunit 250, an X1 subunit 260, an X2 subunit 280, an X3 subunit 300 and an Averager subunit 320. The dither and requantization subunit 250 receives the Dither[10:0] signal and the RawResOut[11:0] signal, which are provided to an addition node 252. The output of the addition node 252 is thus the dithered RawResOut[11:0] signal, which is applied to a digital requantizer block 254. When the dithered RawResOut[11:0] signal is greater than 1024, block 254 outputs a 1; when the dithered RawResOut[11:0] signal is less than 1024, block 254 outputs a −1; when the dithered RawResOut[11:0] signal is anything else, block 254 outputs a zero. The requantization converts the twelve bit wide RawResOut[11:0] signal to a two bit wide signal. This makes it possible for the subsequent calculations to be performed in real time at rates that allow impressive performance using processors and digital circuitry presently available on the commercial market. Since the calculations involve averages over many periods, even with the reduction in resolution from twelve bits to two bits, accuracy of the estimation calculations in the ME unit 206 is adequate to nearly the same reduction in the shuffling noise, compared to estimations done with calculations with twelve bit RawResOut[11:0] signals. The dithering ensures that the error due to the requantization from 12$b$ to 2$b$ is white. If it were not, then the estimation would not work as well, since PN correlated with white noise gives a substantially zero output.

The dithered and requantized RawResOut signal from the dither and requantization subunit 250 is provided via signal path 256 to the other subunits. The X1 subunit 260 takes the dithered and requantized RawResOut signal and determines the value of X1[15:0], discussed above. The X2 subunit 280 takes the dithered and requantized RawResOut signal and determines the value of X2[15:0], discussed above. The X3 subunit 300 takes the dithered and requantized RawResOut signal and determines the value of X3[15:0], discussed above.

In the X1 subunit 260, for each sample the dithered and requantized RawResOut signal is provided as an input to a simplified multiplication unit 262, as is the value PN1'_1. The simplified multiplication unit 262 multiplies these inputs to provide intermediate product value $V_1$. The simplified multiplication unit 262 is described in detail below. The value $V_1$ is provided to decision blocks 264 and 266. Per block 264, if the value of $\gamma_1$ (Gama1[1:0]) is equal to 1, then a stored value representing the accumulated sum of the values, Sum_Gama1, has $V_1$ added to it 268. Per block 266, if the value of $\gamma_1$ is equal to −1, then Sum_Gama1, has $V_1$ subtracted from it 270. An accumulated count value, Count1_Sum, is then incremented by one 272, to record the processing of the current sample. Then, Count1_Sum is compared 274 with a predetermined binary number $2^n$, which is preferably in the range of at least $10^7$ to $10^8$, with n≅27 being an appropriate value, to provide the desired high degree of accuracy. If Count1_Sum is not yet equal to $2^n$, no further action is taken with respect to the current sample, and the processing simply resumes with the next sample. However, if Count1_Sum is equal to $2^n$, then an intermediate value of X1 having nineteen bits of accuracy, X1_Ave, is calculated 276, being:

$$X1\_Ave = \frac{Sum\_Gama1}{Count1\_Sum}.$$

This is rounded and scaled 278 to yield X1[15:0], which is provided as an output of the ME unit 206.

The same process is performed with respect to the other PN and gamma values, to yield X2[15:0] and X3[15:0].

Thus, in the X2 subunit 280, for each sample the dithered and requantized RawResOut signal is provided as an input to a simplified multiplication unit 282, as is the value PN1'_2. A simplified multiplication unit 282 multiplies these inputs to provide intermediate product value $V_2$. The simplified multiplication unit 282 is the same as simplified multiplication unit 262, and is described in detail below. The value $V_2$ is provided to decision blocks 284 and 286. Per block 284, if the value of $\gamma_2$ (Gama2[1:0]) is equal to 1, then a stored value representing the accumulated sum of the values, Sum_Gama2, has $V_2$ added to it 288. Per block 286, if the value of $\gamma_2$ is equal to −1, then Sum_Gama2, has $V_2$ subtracted from it 290. An accumulated count value, Count2_Sum, is then incremented by one 292, to record the processing of the current sample. Then, Count2_Sum is compared 294 with the predetermined binary number $2^n$, which is the same number $2^n$ used in decision block 274, discussed above. If Count2_Sum is not yet equal to $2^n$, no further action is taken with respect to the current sample, and the processing simply resumes with the next sample. However, if Count2_Sum is equal to $2^n$, then an intermediate value of X2 having nineteen bits of accuracy, X2_Ave, is calculated 296, being:

$$X2\_Ave = \frac{Sum\_Gama2}{Count2\_Sum}.$$

This is rounded and scaled 298 to yield X2[15:0], which is provided as an output of the ME unit 206.

Likewise, in the X3 subunit 300, for each sample the dithered and requantized RawResOut signal is provided as an input to a simplified multiplication unit 302, as is the value PN1'_3. A simplified multiplication unit 302 multiplies these inputs to provide intermediate product value $V_3$. The simplified multiplication unit 302 is the same as simplified multiplication unit 262, and is described in detail below. The value $V_3$ is provided to decision blocks 304 and 306. Per block 304, if the value of 72 (Gama2[1:0]) is equal to 1, then a stored value representing the accumulated sum of the values, Sum_Gama3, has $V_3$ added to it 308. Note that this decision is actually conditioned on the value of $\gamma_3$; the reason $\gamma_2$ is used in this block is because $\gamma_3=\gamma_2$. Per block 306, if the value of $\gamma_2$ is equal to −1, then Sum_Gama3, has $V_3$ subtracted from it 310. An accumulated count value, Count3_Sum, is then incremented by one 312, to record the processing of the current sample. Then, Count3_Sum is compared 314 with the predetermined binary number $2^n$, which is the same number $2^n$ used in decision blocks 274 and 294, discussed above. If Count3_Sum is not yet equal to $2^n$, no further action is taken with respect to the current sample, and the processing simply resumes with the next sample. However, if Count3_Sum is equal to $2^n$, then an intermediate value of X3 having nineteen bits of accuracy, X3_Ave, is calculated 316, being:

$$X3\_Ave = \frac{Sum\_Gama3}{Count3\_Sum}.$$

This is rounded and scaled 318 to yield X3[15:0], which is provided as an output of the ME unit 206.

The Averager subunit 320 performs the same processes as those performed in sub-units 260, 280 and 300. However, the offset [10:0] is computed as the average value of the output of unit 254, scaled by $2^{11}$. The accumulator process in the Averager subunit 320 is performed on each sample and does not depend on PN or $\gamma$ values for the accumulation. In this way, the Averager subunit 320 determines any voltage offset that may be present in the RawResOut[11:0] signal, and provides a quantified signal OFFSET[10:0], having eleven bits, equal to that offset. The OFFSET[10:0] signal is used in a cancellation stage, described in detail below.

The outputs X1[15:0], X2[15:0] and X3[15:0] and the OFFSET[10:0] signal are provided as inputs to the MNC unit 212. In addition to the signals mentioned above, the MNC unit 212 also receives the clock $\phi1$ signal, and the RawResOut[11:0] signal, and provides a Corrected Output [11:0], having twelve bits, which is the ADC output corrected by having its capacitor mismatch converted into white noise, and by having that white noise substantially cancelled by application of the principles of the present invention.

To accomplish this, the MNC unit 212 performs the calculations involved in implementing Equation (5). The performance of these calculations is facilitated in the preferred embodiment by the application of two optimizing methodologies. First, the equations are broken down into more easily executable equations. Second, the implementation of these equations is optimized for speed, while minimizing circuitry, if implemented in hardware, or processing time, if implemented in software. The application of these methodologies is described in detail below.

In the implementation of the MNC unit 212, Equation (5) is broken down into the following equations:

$ECX1 = PN1 \cdot X1 \cdot \gamma_1 =$ error correction due to X1

$ECX2 = PN2 \cdot X2 \cdot \gamma_2 =$ error correction due to X2

$ECX3 = PN3 \cdot X3 \cdot \gamma_3 =$ error correction due to X3

$ECX12 = PN1 \cdot PN2 \cdot X2 \cdot \gamma_{12} =$ error correction due to $\gamma_{12}$ $ECX13 = PN1 \cdot PN3 \cdot X3 \cdot \gamma_{12} =$ error correction due to $\gamma_{13}$, where $\gamma_{13} = \gamma_{12}$.
Simplifying:

$ECXSUM = ECX1 + ECX2 + ECX3 + ECX12 + ECX13$.

Then:

$RawOutDAC = RawResOut[11:0] - ECXSUM \cdot 2^{(m2-1)}$.

where $m^2$ is a scaling factor equal to the width of the rest of the pipeline. Further, the mismatch term is:

MismatchTerm = $PN1 \cdot X1 + PN2 \cdot X2 + PN3 \cdot X3 - PN1 \cdot PN2 \cdot X2 + PN1 \cdot PN3 \cdot X3$.

Also, the total correction factor is:

TotCorrfactor = 1 − MismatchTerm.

and, finally:

CORRECTED OUTPUT = $RawOutDAC \cdot TotCorrfactor$, where CORRECTEDC OUTPUT is the twelve bit output of the MNC unit 212.

Figure 13:
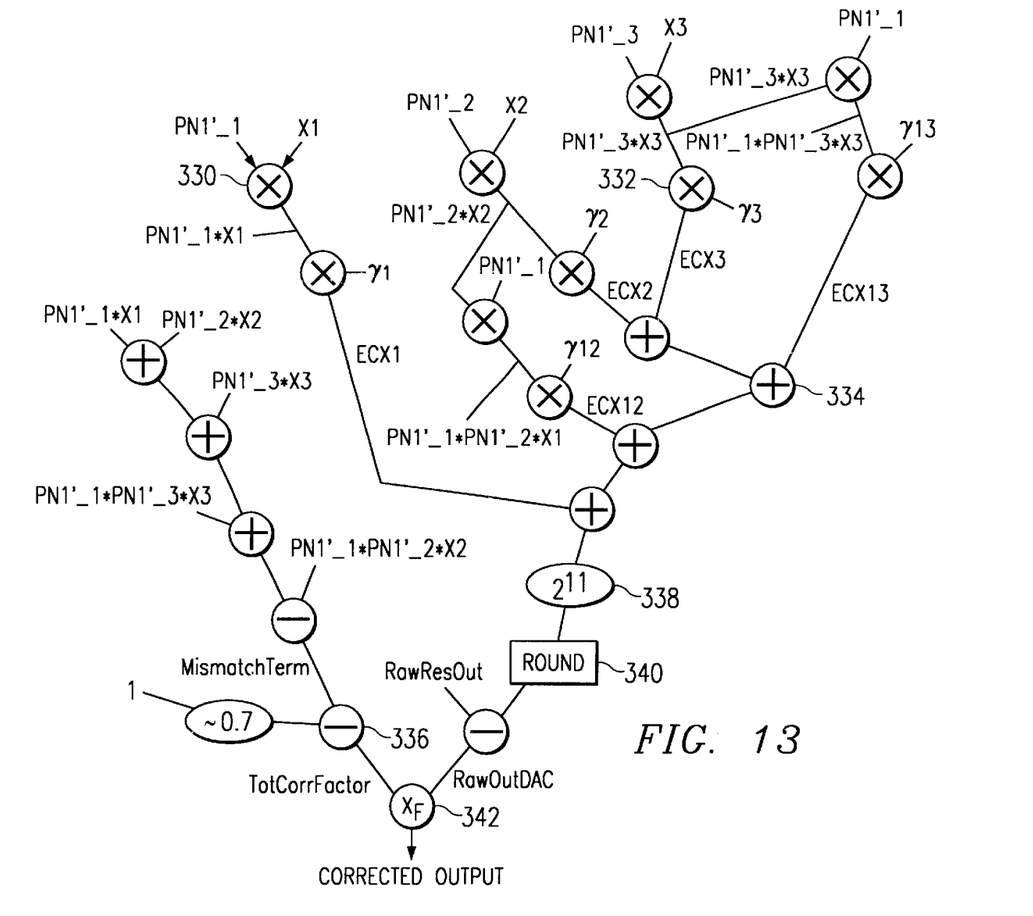
FIG. 13 is a signal flow graph for certain calculations involved in the practice of the preferred embodiment of the present invention.

A signal flow graph for these calculations is shown in FIG. 13. All computations in the figure are in signed, 2's complement format. Nodes including an X, such as nodes 330 and 332 are multiplication nodes preferably implemented in simplified logic that performs the logical equivalent of a full parallel multiplier. Nodes including a +, such as node 334, are addition nodes. Nodes including a −, such as node 336, are subtraction nodes. Elliptical nodes 338 and 340 are scaling nodes which scale a 2's complement number. The scaling in node 338 corresponds to a multiplication or division by $2^{11}$. ECXSUM is represented as S<17,19,t>, that is, 17 physical bits and 19 bits of accuracy to account for overflows/underflows encountered when computing:

$EXCSUM = ECX1 + ECX2 + ECX3 + ECX12 + ECX 13$.

Multiplying ECXSUM by $2^{(m2-1)}$, i.e., $2^{11}$, is achieved by scaling it to be represented as S<17,8,t> and finally, before subtraction from RawResOut[11:0], it is rounded in node 342. Node 340 scales by a factor of approximately 0.7. Before computing TotCorrFactor = 1 − MismatchTerm, the 1 in this equation is scaled by approximately 0.7, so that it can have the same number representation as the MismatchTerm. Node 344 is a multiplication node preferably implemented as a full parallel multiplier.

Figure 14:
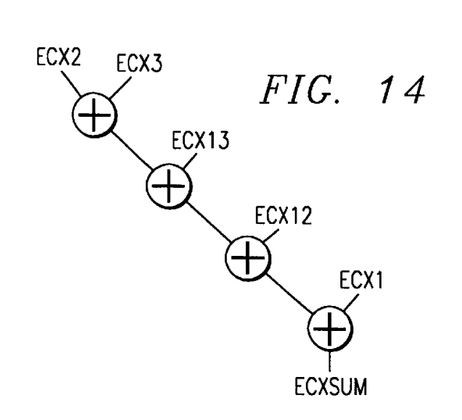
FIG. 14 is a signal flow graph for certain portions of the flow graph of FIG. 13.
Figure 15:
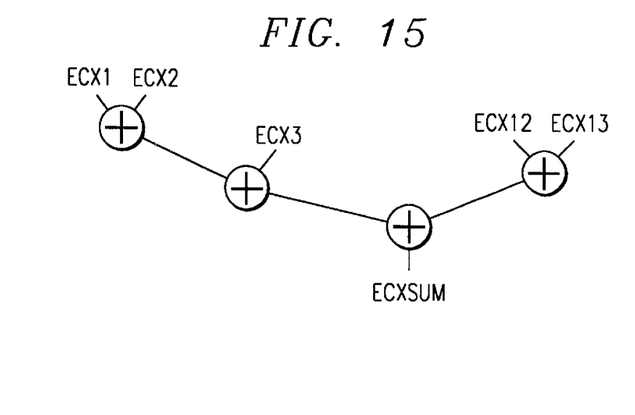
FIG. 15 is a signal flow graph for the same function provided by the flow graph of FIG. 14, in optimized form.

As mentioned above, the implementation of these equations is optimized for speed, while minimizing circuitry, if implemented in hardware, or processing time, if implemented in software. Four methodologies are applied. The first such methodology applied is known, and is commonly referred to as Tree-Height Reduction. By way of example, this is accomplished as follows. FIG. 14 shows a portion of the signal flow graph of FIG. 13, specifically, the nodes contributing directly to the calculation of ECXSUM. FIG. 15 shows a signal flow graph accomplishing the same calculation as in FIG. 14, but having been thus optimized. This is preferably applied throughout the signal flow.

The second methodology is the use of carry save adders to reduce the problem of adding three numbers into that of adding merely two numbers, and performing this reduction within a time delay independent of word size. This is a known technique, and so is not discussed further herein. However, it is considered a preferred technique in the implementation discussed herein.

The third methodology applied is a novel technique for the increase of the precision of the architecture, without sacrificing delay and, e.g. silicon area if implemented in hardware. This technique makes use of a bit true C-level model for the architecture that allows the designer to have in-depth insight into all the intermediate variables and their upper and lower ranges. This approach allows the use of precision that is equivalent to 19-bits of precision, while only having 16 physical bits. This amounts to an increase of the precision of computations, for a given word size, by a factor of eight.

This is accomplished as follows. To represent a signed fixed point number in 2's complement format, the following representation is used:

$$S<wsize,bp,t>,$$

where:
wsize represents the word size,
bp represents the binary-point position within the fixed-point word, and
t signifies the fact that this signed number is represented in 2's complement format. The real value of a fixed-point number represented in the form of $S<wsize,bp,t>$ is as follows:

$$2^{-bp} \cdot \left( -b_{wsize-1} \cdot 2^{wsize-1} + \sum_{i=0}^{wsize-2} b_i \cdot 2^i \right).$$

Figure 16:
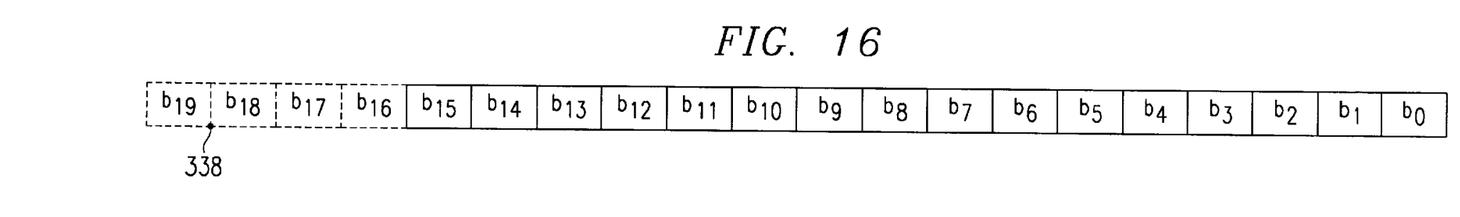
FIG. 16 is a diagram of an extended precision fixed point format used for certain signals in the preferred embodiment of the present invention.

The binary-point bit position within the fixed point word determines the precision with which the fixed point word can represent numbers. For the purposes of the preferred embodiment of the present invention, the inputs to the computations have three variables that require high precision. These variables, X1, X2 and X3, as discussed above, represent several linear combinations of the capacitance mismatches in the pipeline stage of the ADC. The fixed-point representation is in the form of $S<16,19,t>$. An example of this format is shown in FIG. 16, where it can be seen that only while 16 bits are used, $b_0$–$b_{15}$, with the MSB being bit $b_{15}$, the decimal point 338 is effectively at bit position $b_{19}$. Thus, the desired increase in precision is accomplished. In practice, the designer simply needs to determine the resulting decimal placement of the results of computations, and deal with the values accordingly. However, a great reduction in hardware, if so implemented, is accomplished while preserving a high degree of precision.

The fourth methodology is the use of simplified logic, mentioned above in connection with the discussion of FIG. 13, to implement certain parallel multiplications, specifically, those with wide discrepancy in their bit widths.

Figure 17:
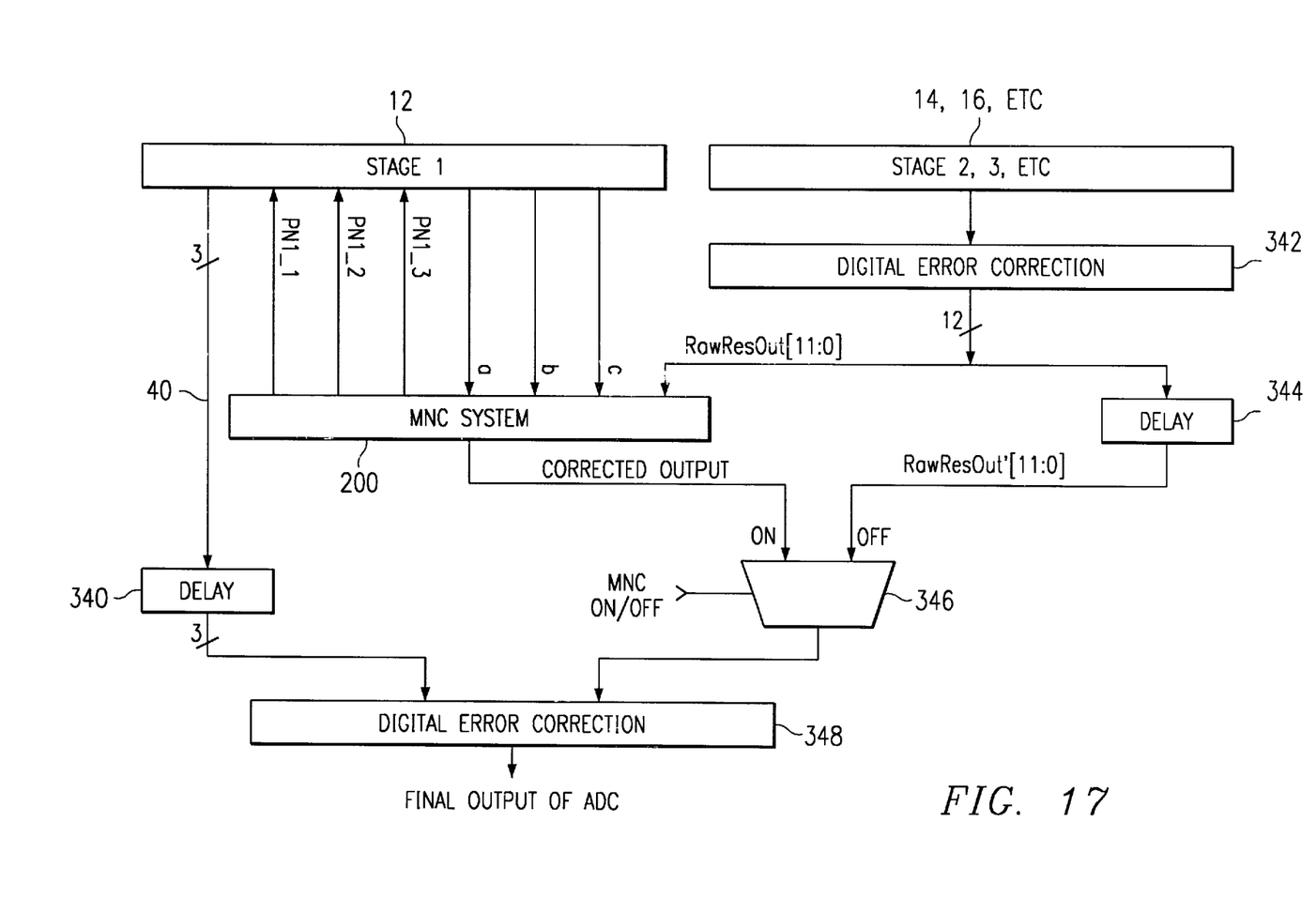
FIG. 17 is a block diagram showing the combination of the CORRECTED OUTPUT with the output of the first stage of the pipelined ADC to arrive at the final output of the pipelined ADC.

As discussed above, the CORRECTED OUTPUT is the residue voltage of the remaining stages 14, 16, etc., of the ADC 10 (FIG. 1), after the first stage 12, which is the stage having shuffling for which noise reduction has been provided as described above. The last step in the method of the preferred embodiment of the present invention is the combination of the CORRECTED OUTPUT with the output of the stage 12 to arrive at the final output of the ADC 10. FIG. 17 is a block diagram showing how this is accomplished.

In FIG. 17 can be seen the first stage 12 having as inputs the three pseudorandom values to control capacitor shuffling, PN1_1, PN1_2 and PN1_3, and having as outputs the capacitor connection codes a, b and c, and also the first stage output on line 40. The capacitor connection codes a, b and c, are provided as inputs to the MNC system 200. The first stage output is provided as an input to a first delay unit 340. The stages 14, 16, etc., subsequent to the first stage provide a digital output representing the residue voltage of the first stage, to a first digital error correction unit 342, which is of conventional design. The corrected output, RawResOut[ 11:0] is provided as an input to the MNC System 200, as well as to a second delay unit 344. The output of the MNC System 200, namely CORRECTED OUTPUT, and the output of delay unit 344 are provided as inputs to a multiplexer 346, which selects between the inputs under control of an MNC ON/OFF signal, which enables selection between mismatch error correction enabled, and mismatch error correction disabled, respectively. The output of the multiplexer 346 is provided to a final stage digital error correction unit 348 of conventional design, where it is also combined in a conventional manner, e.g. by overlapping the LSB of the preceding stage with the MSB of the current stage. The output of the digital error correction unit 348 is the final output of the ADC 10.

It should be noted that the signals at the outputs of the first digital error correction unit 342, the first delay unit 340, the second delay unit 344, and of the multiplexer 346 are all in 2's complement format.

Although the present invention and its advantages have been described in detail, it should be understood that various changes, substitutions and alterations can be made herein without departing from the spirit and scope of the invention as defined by the appended claims.

What is claimed is:

1. In a pipelined analog-to-digital converter (ADC) having an analog input signal and a digital output signal, and having a plurality of pipelined stages, each such stage having an analog input, an analog output comprising a residue voltage, and a digital output, said stage including a digital-to-analog converter substage having a plurality of capacitors and which are used in a sample-and-hold function and shuffled according to a predetermined procedure, a method for reducing noise generated from said shuffling when said capacitors are mismatched, comprising the steps of:
providing a model of the stage and representing the residue voltage based on said model, said representation of said residue voltage including a component representing the noise generated from said shuffling;
estimating mismatches among capacitors in said stage, based on the monitoring of an output parameter of said stage;
generating a cancellation factor by applying said mismatch estimations to said estimation model; and
subtracting said cancellation factor from an ADC output to substantially reduce and/or effectively cancel the mismatch noise.

2. A method according to claim 1 wherein said predetermined procedure involves providing a pseudo-noise (PN) code sequence and shuffling said capacitors according to said PN code sequence, and wherein said step of estimating is performed by monitoring said residue voltage of said stage; and correlating said PN code sequence with said residue voltage of said stage.

3. A method according to claim 1 wherein said predetermined procedure involves providing a pseudo-noise (PN) code sequence and a Walsh code sequence, and determining a code sequence representing the product of such code sequences, and shuffling said capacitors according to said product code sequence, and wherein said step of estimating is performed by monitoring said residue voltage of said stage; and correlating said product code sequence with said residue voltage of said stage.

4. A method according to claim 2 wherein said step of providing an estimation model is performed by providing a process estimating the noise, $Noise_{DAC}$, generated from said shuffling as:

$$Noise_{DAC} = \frac{1}{G}\left\{\sum_{i=1}^{3} PN_i \hat{\Delta}_i \gamma_i \right\} + \frac{1}{G} PN_1 PN_2 \hat{\Delta}_2 \gamma_{12} - \frac{1}{G} PN_1 PN_3 \hat{\Delta}_3 \gamma_{13},$$

wherein:

G represents the interstage gain error, $PN_i$ represents the ith PN code in said PN code sequence, $\gamma_1$, $\gamma_{12}$ and $\gamma_{13}$ represent factors corresponding to capacitor connections that are shuffled, and $\hat{\Delta}_i$ represents a mismatch parameter in accordance with $$\hat{\Delta}_i = \frac{G \cdot \text{Avg}\{PN_i \cdot V_{RES}\}}{\text{Avg}\{\gamma_i\}},$$

where $V_{RES}$ represents said residue voltage.

* * * * *